US012598855B2

(12) United States Patent
Park et al.

(10) Patent No.: US 12,598,855 B2
(45) Date of Patent: Apr. 7, 2026

(54) MEMRISTOR DEVICE, METHOD OF FABRICATING THE SAME, SYNAPTIC DEVICE INCLUDING THE SAME, AND NEUROMORPHIC DEVICE INCLUDING THE SYNAPTIC DEVICE

(71) Applicants: SK hynix Inc., Icheon (KR); Korea Advanced Institute of Science and Technology, Daejeon (KR)

(72) Inventors: Sang Su Park, Icheon (KR); Sung Yool Choi, Daejeon (KR); Jun Hwe Cha, Daejeon (KR); Jung Yeop Oh, Daejeon (KR)

(73) Assignees: SK hynix Inc., Icheon (KR); Korea Advanced Institute of Science and Technology, Daeieon (KR)

( * ) Notice: Subject to any disclaimer, the term of this patent is extended or adjusted under 35 U.S.C. 154(b) by 466 days.

(21) Appl. No.: 18/188,360

(22) Filed: Mar. 22, 2023

(65) Prior Publication Data

US 2023/0309327 A1 Sep. 28, 2023

(30) Foreign Application Priority Data

Mar. 23, 2022 (KR) ......................... 10-2022-0036243

(51) Int. Cl.
*H10K 10/50* (2023.01)
*H10B 63/00* (2023.01)
(Continued)

(52) U.S. Cl.
CPC ............. *H10K 10/50* (2023.02); *H10B 63/20* (2023.02); *H10K 10/82* (2023.02); *H10K 71/10* (2023.02); *H10K 85/111* (2023.02)

(58) Field of Classification Search
CPC ..... H10K 10/50; H10K 85/111; H10N 70/884
(Continued)

(56) References Cited

U.S. PATENT DOCUMENTS

| 2011/0133152 A1* | 6/2011 | Choi | ...................... H10N 70/25 |
| | | | 257/4 |
| 2022/0158094 A1* | 5/2022 | Jung | .................. H10N 70/8833 |

FOREIGN PATENT DOCUMENTS

| KR | 1020130021864 A | 3/2013 |
| KR | 101973110 B1 | 4/2019 |

(Continued)

*Primary Examiner* — Quoc D Hoang

(57) ABSTRACT

A memristor device, a fabricating method thereof, a synaptic device including the memristor device, and a neuromorphic device including the synaptic device are provided. The memristor device includes a first electrode, a second electrode spaced apart from the first electrode, a resistance change layer disposed between the first electrode and the second electrode and including a polymer, and an insertion layer disposed between the first electrode and the resistance change layer and including an oxide. An electrochemical metallization mechanism (ECM) filament is formed in the resistance change layer, and a valence change mechanism (VCM) filament is formed in the insertion layer. The memristor device has a synaptic characteristic according to a change in resistance of the resistance change layer. The insertion layer includes an $Al_2O_3$ layer. The insertion layer includes an $Al_2O_3$ layer formed by an atomic layer deposition (ALD) process using a temperature of about 200° C. or higher.

17 Claims, 15 Drawing Sheets

(51) Int. Cl.
H10K 10/82 (2023.01)
H10K 71/10 (2023.01)
H10K 85/10 (2023.01)

(58) Field of Classification Search
USPC ........................................................ 257/40
See application file for complete search history.

(56) References Cited

FOREIGN PATENT DOCUMENTS

| KR | 1020190092577 A | 8/2019 |
| KR | 1020210056541 A | 5/2021 |

* cited by examiner $\alpha_R$ of copper nanowire

MEMRISTOR DEVICE, METHOD OF FABRICATING THE SAME, SYNAPTIC DEVICE INCLUDING THE SAME, AND NEUROMORPHIC DEVICE INCLUDING THE SYNAPTIC DEVICE

CROSS-REFERENCES TO RELATED APPLICATION

The present application claims, under 35 U.S.C. § 119(a), the benefit of Korean Patent Application No. 10-2022-0036243, filed on Mar. 23, 2022, which is herein incorporated by reference in its entirety.

BACKGROUND OF THE INVENTION

1. Field

Embodiments of the present disclosure relate to an electronic device and its applications, and more particularly, to a memristor device, a method of fabricating the memristor device, a synaptic device including the memristor device, and a neuromorphic device including the synaptic device.

2. Description of the Related Art

With the rapid development of software and hardware, artificial intelligence (AI) technologies such as real-time image analysis and language translation are emerging. However, since an artificial neural network using a computing device based on a graphic processing unit (GPU) uses von Neumann architecture in which a memory and a processor are separated, it has inefficiency in energy consumption. Accordingly, a software-based artificial neural network system using a cloud server is being utilized instead of directly performing an artificial intelligence-based algorithm operation in a portable terminal. When using the cloud server, since considerably long latency (i.e., a waiting time) and security issues entail, alternative technology capable of implementing an artificial neural network in a portable terminal is required. Accordingly, research to implement biomimetic computing by using analog memory devices is being actively conducted without employing the von Neumann architecture.

Memristor is a compound word of memory and resistor, and a memristor device is a two-terminal device whose resistance state is changed by an external electrical stimulus. In particular, since the memristor device has a simple structure, it has been studied to be implemented in high-density memory applications. In addition, the memristor device may simultaneously implement memory and computational functions, and may simulate the role of synapses in a brain through the reinforcement of analog operation characteristics. The memristor device is broadly classified into two types. One type is OxRAM (oxide-based RAM) which forms a conductive path by oxygen voids (or vacancies) in a metal oxide film, and the other type is CBRAM (conductive bridge RAM) which forms a conductive path through penetration of metal ions into an electrolyte.

The CBRAM has advantages such as a fast operation speed, high miniaturization potential, freedom in medium selection, and a high ON/OFF ratio. However, in the CBRAM, when a conducting filament connecting a lower electrode and an upper electrode comes into contact with the lower/upper electrode, it is difficult to implement a gradual disruption of the conducting filament due to the strong interaction between metals in the conducting filament.

Therefore, the CBRAM has a disadvantage that it is difficult to implement analog switching-based characteristics. In addition, it is difficult to implement switching characteristics with excellent reliability due to the randomness (or irregularity) of the generation and disruption of the conducting filament.

Most studies related to the existing CBRAM-based synaptic device have focused on the linear update (or increase) of conductivity according to an in-situ training method, and development of technology to improve/secure the reliability (e.g., long-term state reliability) of conductivity values of synaptic devices is insufficient. In addition, according to the recently reported content, the CBRAM is being discussed as a synaptic device which may be more optimized for ex-situ training. Accordingly, there is a demand for the development of a CBRAM memristor device having a property of reaching a desired target conductivity value and improved long-term state reliability along with a linear update property of conductivity.

SUMMARY OF THE INVENTION

An object of the present disclosure is to provide a memristor device having a property of reaching a desired target conductivity value and improved long-term state reliability as well as excellent and stable synaptic properties.

In addition, the technical object to be achieved by the present disclosure is to provide a method of fabricating the above-described memristor device.

Another technological object to be achieved by the present disclosure is to provide a synaptic device including the above-described memristor device.

In addition, the technical object to be achieved by the present disclosure is to provide a neuromorphic device including the above-described synaptic device.

The object problem to be achieved by the present disclosure is not limited to the above-mentioned ones, and the other objects which are not mentioned will be understood by those skilled in the art from the following description.

According to one embodiment of the present invention, there is provided a memristor device comprising: a first electrode; a second electrode disposed to be spaced apart from the first electrode; a resistance change layer disposed between the first electrode and the second electrode and including a polymer; and an insertion layer disposed between the first electrode and the resistance change layer and including an oxide, and wherein an electrochemical metallization mechanism (ECM) filament is formed in the resistance change layer, a valence change mechanism (VCM) filament is formed in the insertion layer, and the memristor device may has a synaptic characteristic according to a change in resistance of the resistance change layer.

The insertion layer may include an $Al_2O_3$ layer.

The insertion layer may include an $Al_2O_3$ layer formed by an atomic layer deposition (ALD) process using a process temperature of about 200° C. or higher.

The insertion layer may have a thickness of about 1 nm to about 50 nm.

The polymer may include V3D3 (1,3,5-trivinyl-1,3,5-trimethylcyclotrisiloxane).

The resistance change layer may have a thickness of about 5 nm to 100 nm.

The resistance change layer may be a single film made of the polymer, the insertion layer may be a single film made of the oxide, a first surface of the insertion layer may be in contact with the first electrode, and a second surface opposing to the first surface of the insertion layer may be in contact with the resistance change layer, and a first surface of the resistance change layer may be in contact with the insertion layer, and a second surface opposing to the first surface of the resistance change layer may be in contact with the second electrode.

The first electrode may include at least one of Pt and Al.

The second electrode may include at least one of Cu, Ag, and Ni.

Potentiation of the memristor device by gradual increase in conductivity of the resistance change layer may be performed according to a current sweep method.

According to another embodiment of the present invention, there is provided a method of fabricating a memristor device comprising: forming a first electrode; forming an insertion layer including an oxide on the first electrode; forming a resistance change layer including a polymer on the insertion layer; and forming a second electrode on the resistance change layer, wherein an electrochemical metallization mechanism (ECM) filament is formed in the resistance change layer, a valence change mechanism (VCM) filament is formed in the insertion layer, and the memristor device has a synaptic characteristic according to a change in resistance of the resistance change layer.

The insertion layer may include an $Al_2O_3$ layer.

The insertion layer may include an $Al_2O_3$ layer formed by an atomic layer deposition (ALD) process using a process temperature of about 200° C. or higher.

The insertion layer may have a thickness of about 1 nm to about 50 nm.

The polymer may include V3D3 (1,3,5-trivinyl-1,3,5-trimethylcyclotrisiloxane).

The resistance change layer may be formed by an initiated chemical vapor deposition (iCVD) process.

The resistance change layer may have a thickness of about 5 nm to 100 nm.

According to another embodiment of the present invention, a synaptic device including the above-described memristor device is provided.

According to another embodiment of the present invention, a neuromorphic device including the above-described synaptic device is provided.

According to embodiments of the present invention, it is possible to implement a memristor device having a property to reach a desired target conductivity value and having improved long-term state reliability as well as excellent and stable synaptic characteristics (e.g., analog switching characteristics).

It is possible to implement a synaptic device having excellent performance and reliability (e.g., long-term state reliability) and a neuromorphic device by applying the memristor device according to these embodiments.

DETAILED DESCRIPTION OF THE INVENTION

Figure 1:
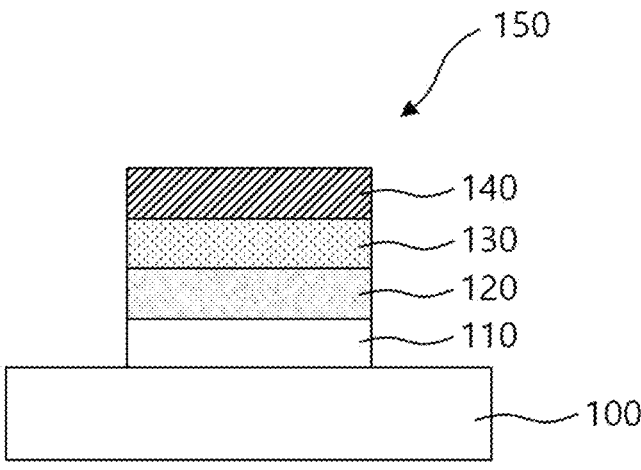
FIG. 1 is a cross-sectional view illustrating a memristor device according to an embodiment of the present disclosure.

The embodiments of the present disclosure to be described below are provided to more clearly explain the present invention to those having common knowledge in the related art, and the scope of the present invention is not limited by the following embodiments. The following embodiment may be modified in many different forms.

The terminology used herein is used to describe specific embodiments, and is not used to limit the present invention. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about," "substantially," etc. are used as a range of the numerical value or degree, in consideration of inherent manufacturing and material tolerances, or as a meaning close to the range. Furthermore, accurate or absolute numbers provided to aid the understanding of the present application are used to prevent an infringer from using the disclosed present invention unfairly.

Hereinafter, the embodiments of the present disclosure will be described in detail with reference to the accompanying drawings. The size or the thickness of regions or parts illustrated in the accompanying drawings may be slightly exaggerated for clarity and convenience of description. The same reference numerals refer to the same elements throughout the detailed description.

FIG. 1 is a cross-sectional view illustrating a memristor device 150 according to an embodiment of the present disclosure.

Referring to FIG. 1, the memristor device 150 may be provided on a predetermined substrate 100. The substrate 100 may include a semiconductor or an insulator, and may include one or more of various structures such as a device layer, a doped region, and a metal line for power supply, peripheral circuitry, and a signal bus structure, as non-limiting examples. The memristor device 150 may include a first electrode 110 corresponding to an inert electrode, a second electrode 140 corresponding to an active electrode and disposed to be spaced apart from the first electrode 110, a resistance change layer 130 disposed between the first electrode 110 and the second electrode 140 and including a polymer functioning as an electrolyte, and an insertion layer 120 disposed between the first electrode 110 and the resistance change layer 130 and including an oxide (e.g., insulating oxide). The resistance change layer 130 may be referred to as a "polymer resistance change layer," and the insertion layer 120 may be referred to as an "oxide insertion layer (or oxide insulating layer)." The memristor device 150 may have a configuration in which the first electrode 110, the insertion layer 120, the resistance change layer 130, and the second electrode 140 are sequentially stacked over the substrate 100 in a direction perpendicular to a top surface of the substrate 100.

In another embodiment, the stacking order of those layers may be reversed. Therefore, the second electrode 140, the resistance change layer 130, the insertion layer 120, and the first electrode 110 are sequentially stacked over the substrate 100. However, embodiments are not limited to such a stacking order.

According to an embodiment, a filament (hereinafter, ECM filament) may be formed in the resistance change layer 130 by an electrochemical metallization mechanism (ECM), and a filament (hereinafter, VCM filament) may be formed in the insertion layer 120 by a valence change mechanism (VCM). The memristor device 150 may have an enhanced synaptic characteristic according to a reversible and continuous resistance change in the resistance change layer 130.

The insertion layer 120 may be made of an oxide, and the VCM filament may be formed by hard breakdown in the insertion layer 120. The VCM filament may include a single filament or plural filaments, but embodiments are not limited thereto. That is, the VCM filament may be formed as a relatively thick filament which is not easily collapsed in a certain region in the insertion layer 120 as oxygen voids or vacancies increase in the certain region. The VCM filament may be formed through a predetermined forming process after the memristor device 150 is formed. The VCM filament of the insertion layer 120 is linked with the ECM filament (i.e., the conductive path) which is formed and collapsed in the resistance change layer 130, thereby minimizing the randomness in the generation, modification, and extinction of the ECM filament. As such, a shape of the ECM filament in the resistance change layer 130 may be controlled by a guide effect and/or a lightning conductor effect by the VCM filament, and accordingly, the randomness in the formation and collapse of the ECM filament may be minimized. In this regard, the long-term state reliability of a conductivity value (or weight value) of the memristor device 150 may be greatly improved. The memristor device 150 may have excellent and stable synaptic characteristics based on analog switching characteristics, and may have characteristics such as reaching a desired target conductivity value and achieving improved long-term state reliability.

In addition, according to the embodiment of the present disclosure, due to a stable voltage distribution effect by the VCM filament of the insertion layer 120, the collapse of the ECM filament in the resistance change layer 130 is predominantly caused by a oxidation-reduction (redox) mechanism rather than a Joule heating mechanism. Therefore, as the ECM filament gradually collapses, electrical conductivity of the resistance change layer 130 may be gradually decreased. If the ECM filament collapses by the Joule heating mechanism, the electrical conductivity of the resistance change layer 130 may be rapidly reduced. However, in the embodiment of the present disclosure, the ECM filament in the resistance change layer 130 may be gradually decomposed according to an oxidation-reduction reaction by the heterogeneous VCM filament in the insertion layer 120, and accordingly, the electrical conductivity of the resistance change layer 130 may be gradually and stably reduced. Therefore, analog-based switching may be achieved by the memristor device 150.

Specifically, the change in resistance of the memristor device 150 according to the embodiment of the present disclosure, that is, the change in the electrical conductivity, may be predominantly based on an electrochemical metallization mechanism (ECM) due to the generation and collapse of ECM filaments. In this regard, the second electrode 140 functions as an active electrode to generate the ECM filament in the resistance change layer 130. A conductive path (i.e., the ECM filament) may be formed as metal ions penetrate and diffuse from the second electrode 140, which is the active electrode, into the resistance change layer 130 toward the first electrode 110.

According to an embodiment of the present disclosure, the insertion layer 120 may include an $Al_2O_3$ layer. As a non-limiting example, the insertion layer 120 may be an $Al_2O_3$ layer formed by an atomic layer deposition (ALD) process using a process temperature of about 200° C. or higher. For example, the $Al_2O_3$ layer may be formed using a process temperature of about 200° C. to about 300° C. When this condition is satisfied, the reliability of a synaptic operation (e.g., analog switching operation) of the memristor device 150 may be increased by the insertion layer 120. The insertion layer 120 formed by the ALD process will be described in more detail later with reference to FIGS. 12A to 12C and FIGS. 13A to 13C.

In one embodiment, a thickness of the insertion layer 120 may be about 1 nm to about 50 nm. When the insertion layer 120 has a thickness exceeding about 50 nm, it may be difficult to form a VCM filament in the insertion layer 120. When the insertion layer 120 has a thickness of less than about 1 nm, permanent dielectric breakdown may occur prior to the formation of the VCM filament in the insertion layer 120. Accordingly, the insertion layer 120 may preferably have a thickness of about 1 nm to 50 nm.

The polymer of the resistance change layer 130 may include V3D3 (1,3,5-trivinyl-1,3,5-trimethylcyclotrisiloxane). The polymer may be pV3D3, or a mixture or copolymer containing V3D3. The polymer may basically have properties of an electrical insulator. As the metal ions of the second electrode 140 are diffused into the resistance change layer 130 toward the first electrode 110, the ECM filament is formed in the resistance change layer 130 to increase the conductivity, and the conductivity of the resistance change layer 130 may be reduced due to decomposition or collapse of the ECM filament that is caused by oxidation-reduction reactions. The resistance change layer 130 may be referred to as a solid electrolyte layer which provides a conductive path for the metal ions.

A thickness of the resistance change layer 130 may be in a range of about 5 nm to about 100 nm or about 5 nm to about 80 nm. When the resistance change layer 130 has the thickness in the above-described thickness range, it may be advantageous to secure the resistance change characteristic of the resistance change layer 130. When the thickness of the resistance change layer 130 is reduced to less than about 5 nm, it may be difficult to maintain the insulation property thereof. When the thickness of the resistance change layer 130 exceeds about 100 nm, it may be difficult to form a filament therein.

In an embodiment of the present disclosure, the resistance change layer 130 may be formed by an iCVD (initiated chemical vapor deposition) process. By lowering a density of the resistance change layer 130 by increasing a deposition rate of the iCVD process, it is possible to intentionally lower the insulating property of the resistance change layer 130, and thus it is possible to enable the memristor device 150 to operate even with the resistance change layer 130 that is relatively thick. However, the thickness range of the resistance change layer 130 may vary depending on embodiments.

Both of the first electrode 110 and the second electrode 140 may include a metal or a metallic material. The first electrode 110 may be an inactive electrode, and in this case, the inactive electrode 110 may include at least one of platinum (Pt) and aluminum (Al). The second electrode 140 may be an active electrode, and in this case, the active electrode 140 may include at least one of copper (Cu), silver (Ag), and nickel (Ni). In an embodiment, the first electrode 110 may include platinum (Pt), and the second electrode 140 may include copper (Cu). However, embodiments are not limited to these materials.

Metal ions of the second electrode 140 may drift within the resistance change layer 130. According to an electrical signal applied between the first electrode 110 and the second electrode 140, the metal ions of the second electrode 140 may move into the resistance change layer 130 to form an ECM filament. The degree of movement of the metal ions may vary according to the intensity of the electrical signal or the number of times of application of the electrical signal, and as a result, the resistance of the resistance change layer 130 may be changed according to the degree of movement of the metal ions.

According to an embodiment of the present disclosure, the resistance change layer 130 may be a single film made of the polymer, and the insertion layer 120 may be a single film made of the oxide. In addition, a first surface of the insertion layer 120 may be in contact with the first electrode 110, and a second surface of the insertion layer 120 opposite to the first surface may be in contact with the resistance change layer 130. A first surface of the resistance change layer 130 may be in contact with the insertion layer 120, and a second surface of the resistance change layer 130 opposite to the first surface may in contact with the second electrode 140.

In an embodiment of the present disclosure, potentiation of the memristor device 150 due to a gradual increase in the conductivity (or electric conductivity) of the resistance change layer 130 may be performed in a current sweep method. For example, it is possible to gradually increase the conductivity of the resistance change layer 130 by the formation of a filament (i.e., ECM filament) by supplying a predetermined current between the first electrode 110 and the second electrode 140 and increasing the intensity of the current, and this gradual increase in the conductivity may be distinguished from the tunneling-based conductivity enhancement that is due to sequential application of a voltage bias. In this way, when the potentiation of the memristor device 150 is performed according to the current sweep method, a current overshooting phenomenon in which the current is rapidly changed may be prevented. Thus, deterioration of the memristor device 150 due to the current overshooting phenomenon may be prevented or suppressed.

According to the embodiment of the present disclosure, the increase in the conductivity of the resistance change layer 130 may be made stably and reliably. In addition, the introduction of the insertion layer 120 and the current sweep method together minimize the soft dielectric breakdown of the resistance change layer 130 and suppress or reduce the destruction of the crystal structure of the resistance change layer 130. Therefore, the electrochemical stability of nanoscale filaments may be secured. In the case of a conventional VCM-based memristor device which does not have an active electrode, since the current sweep method may not be applied, a voltage sweep method is generally used, and in this case, a current overshooting problem may occur, and thus stability of the device may be reduced.

In one embodiment of the present disclosure, the depression of the memristor device 150 by the gradual decrease in the conductivity of the resistance change layer 130 may be performed in a voltage sweep method. For example, the conductivity of the resistance variable layer 130 may be gradually decreased by applying a voltage between the first electrode 110 and the second electrode 140 and increasing the intensity of the voltage in a predetermined direction. In this case, a positive (+) voltage may be applied to the first electrode 110, and a negative (−) voltage may be applied to the second electrode 140. As the negative (−) voltage applied to the second electrode 140 increases in a negative (−) direction, the conductivity of the resistance change layer 130 may be gradually decreased. According to the embodiment of the present disclosure, the reduction in the conductivity of the resistance change layer 130 may be made stably and reliably.

Figure 2:
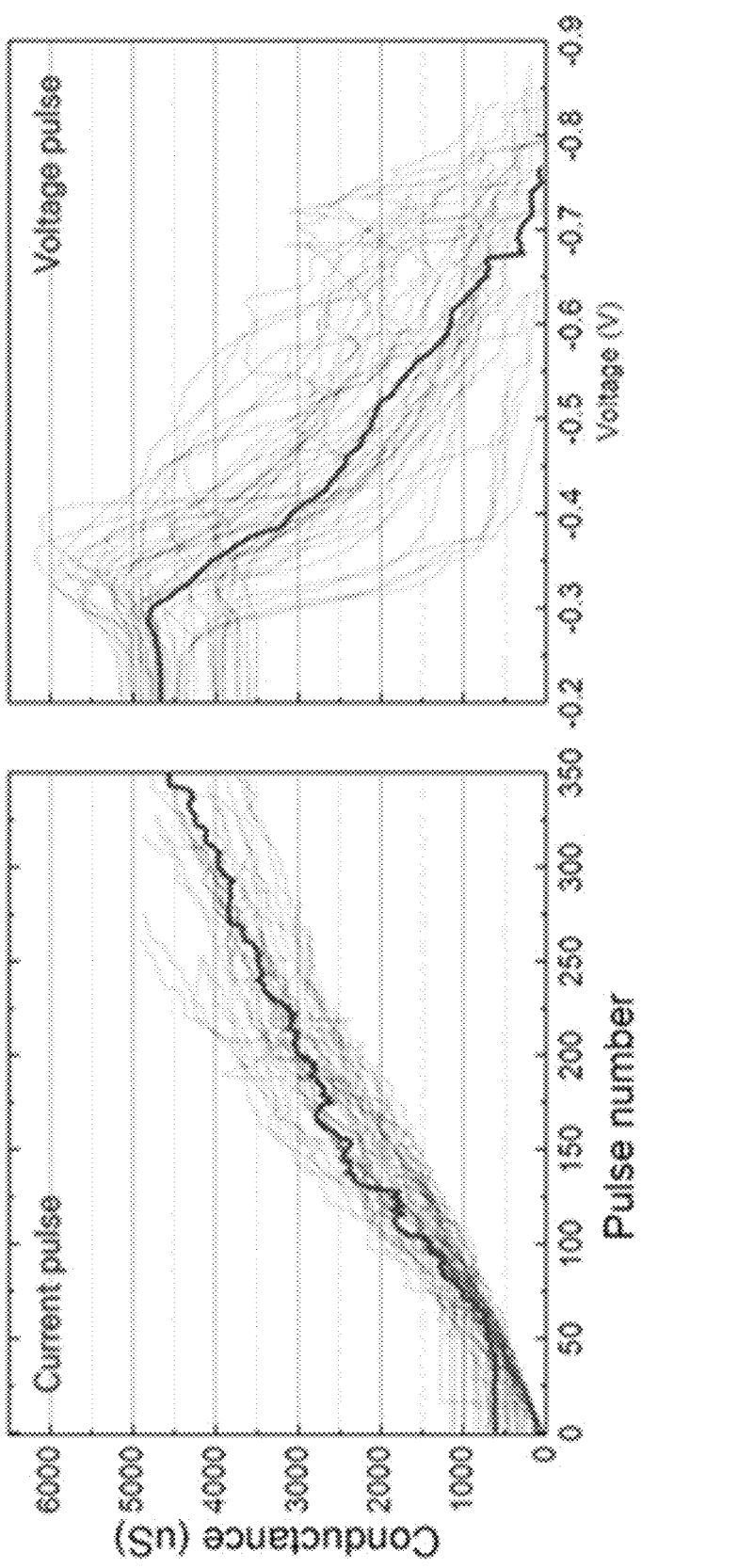
FIG. 2 provides graphs showing a result obtained by evaluating a potentiation-depression characteristic of a memristor device according to an embodiment of the present disclosure.

FIG. 2 provides graphs showing a result obtained by evaluating a potentiation-depression characteristic of a memristor device according to an embodiment of the present disclosure. The graph on the left of FIG. 2 shows a potentiation step for gradually increasing the conductivity of a resistance change layer according to a current sweep method, and the graph on the right side of FIG. 2 shows a depression step for gradually reducing the conductivity of the resistance change layer according to a voltage sweep method. FIG. 2 shows values measured for a plurality of memristor device samples. In each of FIGS. 2A and 2B, a curve treated with a thick line corresponds to a measurement result of a specific sample.

Referring to FIG. 2, the memristor device according to the embodiment of the present disclosure may exhibit a characteristic of gradually (i.e., analogically) and stably changing (increasing and decreasing) the conductivity for both of current sweep and voltage sweep, respectively. In addition, the memristor device may exhibit a characteristic of reaching a desired target conductivity value (i.e., target conductance) within a predetermined range. This result means that the memristor device has excellent synaptic operation characteristics.

Figure 3:
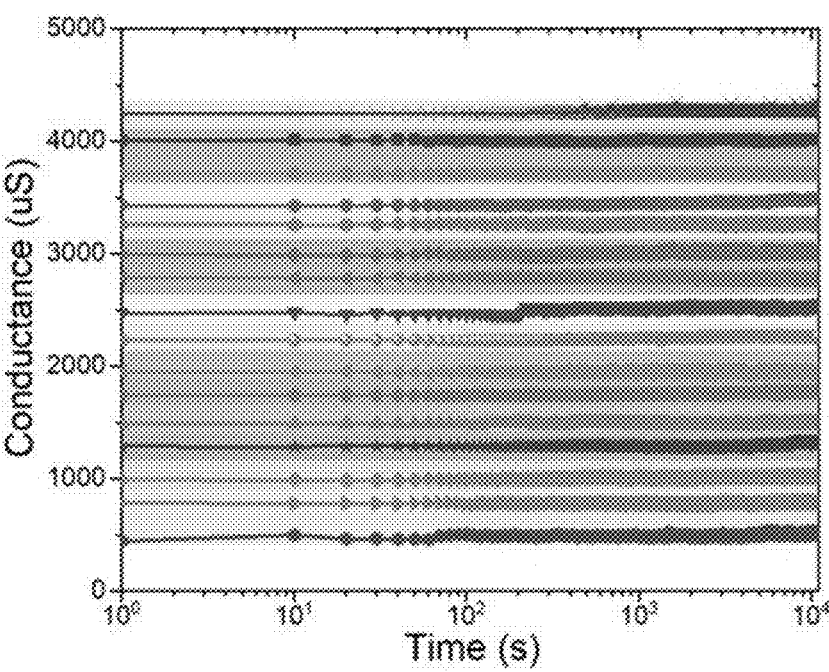
FIG. 3 is a graph showing retention characteristics of a conductivity value of a memristor device according to an embodiment of the present disclosure.

FIG. 3 provides a graph showing retention characteristics of a conductivity value (or weight value) of a memristor device according to an embodiment of the present disclosure.

Referring to FIG. 3, the conductivity values of the memristor device may be maintained substantially the same over time. This shows that the memristor device has excellent long-term state reliability.

According to an embodiment of the present disclosure, the randomness in the formation and collapse of the ECM filament in the resistance change layer 130 may be minimized by inducing a guide effect and a lightning conductor effect using the insertion layer 120 in which the VCM filament is formed. In this regard, the long-term state reliability of the conductivity value (or weight value) of the memristor device 150 may be greatly improved. The memristor device 150 may have excellent and stable synaptic characteristics (or analog switching characteristics) as well as characteristics of reaching the desired target conductivity value and improved long-term state reliability.

In addition, the soft dielectric breakdown of the resistance change layer 130 is minimized by applying the insertion layer 120 in which the VCM filament is formed, and thus it is possible to suppress or reduce the structural deterioration or destruction of the crystal structure of the resistance change layer 130. As a result, it is possible to impart high electrochemical stability to the ECM filament having a nanoscale.

In addition, heterogeneous filaments are formed by applying a plurality of material layers, e.g., the insertion layer 120 and the resistance change layer 130, between the first electrode 110 and the second electrode 140. As a result, it is possible to induce stable destruction of an active filament, that is, the ECM filament, and to ensure high long-term state reliability by generating a voltage distribution effect due to the heterogeneous filaments.

In addition, it is possible to suppress the generation of negative ions by controlling a reduction rate using the insertion layer 120 that is applied between the inactive electrode 110 and the resistance change layer 130. Accordingly, the reduction of the electromotive force due to the negative ions and the generation of zero-voltage electric stress may be minimized, and thus reliability deterioration may be prevented.

In one embodiment of the present disclosure, the insertion layer 120 including an oxide, which is deposited according to the ALD process, may be formed as a buffer layer, and the resistance change layer 130 including a polymer, which is deposited according to the iCVD process, may be formed. A memristor device (or memristor synaptic device) having stable long-term state reliability may be provided through a structural combination of the insertion layer 120 and the resistance change layer 130.

Existing synaptic device-related studies have mainly focused on the linear update of conductivity, but as analog switching characteristics are given to the memristor device, a filament shape also gradually changes over time, resulting in a decrease in long-term state reliability. That is, the analog switching characteristic and the long-term state reliability characteristic may have a trade-off relationship. However, in the embodiment of the present disclosure, the long-term state reliability of the memristor device 150 may be greatly improved through structural engineering of the material layers disposed between the first electrode 110 and the second electrode 140. In particular, by disposing the insertion layer 120 between the first electrode 110 and the resistance change layer 130, it is possible to adjust the shape of the conductive filament (i.e., the ECM filament) causing the conductivity change and to minimize the soft dielectric breakdown of the resistance change layer 130 capable of maintaining the skeleton of the conductive filament (i.e., the ECM filament). In addition, it is possible to optimize concentration gradient of the conductive filament (i.e., the ECM filament) and the metal ions, e.g., copper (Cu) ions, in the resistance change layer. Therefore, it is possible to achieve stable conductivity-weighted long-term state reliability. Through these procedures, it may provide the core technology of building an ex-situ training-type neuromorphic system, and at the same time, it is possible to implement an intelligent electronic system which may process atypical data (e.g., shape, voice, text) more efficiently by building an artificial neural network based on this technology.

FIG. 4A to FIG. 4E are cross-sectional views illustrating a method of fabricating a memristor device according to an embodiment of the present disclosure.

Figure 4A:
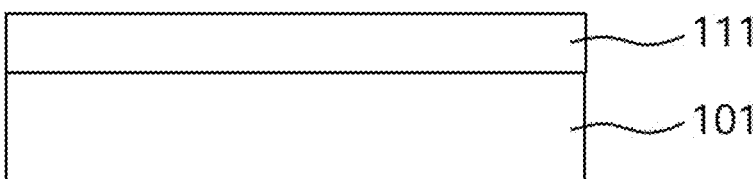
FIG. 4A to FIG. 4E are cross-sectional views illustrating a method of fabricating a memristor device according to an embodiment of the present disclosure.

Referring to FIG. 4A, a first electrode 111 corresponding to an inert electrode may be formed on a substrate 101. The substrate 101 may include a semiconductor or an insulator, and various substrate materials may be applied thereto. The first electrode 111 may include a metal or a metallic material. For example, the first electrode 111 may include at least one of platinum (Pt) and aluminum (Al).

Figure 4B:
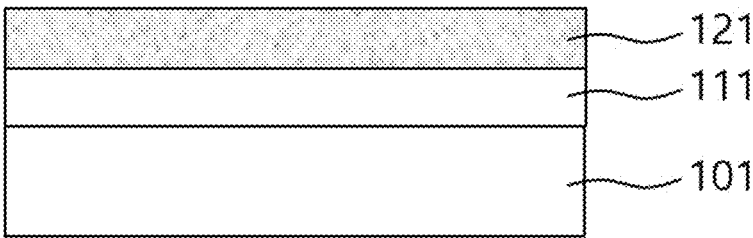

Referring to FIG. 4B, an insertion layer 121 including an oxide may be formed on the first electrode 111. The insertion layer 121 may include an $Al_2O_3$ layer. The insertion layer 121 may be an $Al_2O_3$ layer formed by an atomic layer deposition (ALD) process using a process temperature of about 200° C. or higher. The $Al_2O_3$ layer may be formed by the ALD process using a process temperature of about 200° C. to about 300° C. When this condition is satisfied, the reliability of a synaptic operation (or analog switching operation) of the memristor device may be further improved by the insertion layer 121.

In an embodiment, a thickness of the insertion layer 121 may be about 1 nm to about 50 nm. When the insertion layer 121 has a thickness exceeding about 50 nm, it may be difficult to form a VCM filament in the insertion layer 121. On the other hand, when the insertion layer 121 has a thickness of less than about 1 nm, the effect according to the insertion of the insertion layer 120 may be weakened.

Figure 4C:
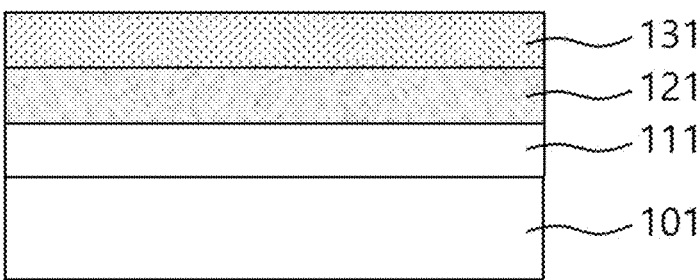

Referring to FIG. 4C, a resistance change layer 131 including a polymer may be formed on the insertion layer 121. The polymer of the resistance change layer 131 may include V3D3 (1,3,5-trivinyl-1,3,5-trimethylcyclotrisiloxane). The polymer may be or include pV3D3. Accordingly, the resistance change layer 131 may be formed of pV3D3. A thickness of the resistance change layer 131 may be in a range of about 5 nm to about 100 nm or about 5 nm to about 80 nm. When the resistance change layer 131 has the above-described thickness range, it may be advantageous to secure the resistance change characteristic of the resistance change layer 131. When the thickness of the resistance change layer 131 is reduced to less than about 5 nm, it may be difficult to maintain the insulation property thereof. When the thickness of the resistance change layer 131 is about 100 nm or more, it may be difficult to form a filament therein.

The resistance change layer 131 may be formed by an initiated chemical vapor deposition (iCVD) process. Since a density of the resistance change layer 131 is lowered by increasing a deposition rate of the iCVD process, it is possible to intentionally lower the insulating property of the resistance change layer 131 to some extent. The iCVD process is a CVD process using an initiator, and uses a chain polymerization reaction using free radicals. In the iCVD process, a polymer thin film may be deposited on a surface of a substrate by vaporizing the initiator and a monomer to cause a polymer reaction in a vapor phase.

Figure 4D:
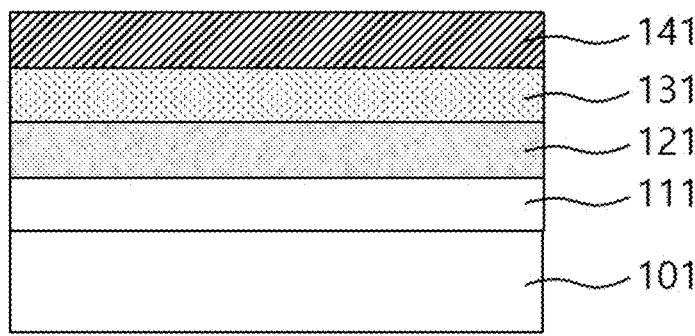

Referring to FIG. 4D, a second electrode 141 corresponding to an active electrode may be formed on the resistance change layer 131. The second electrode 141 may include a metal or a metallic material. For example, the second electrode 141 may include at least one element among copper (Cu), silver (Ag), and nickel (Ni).

Figure 4E:
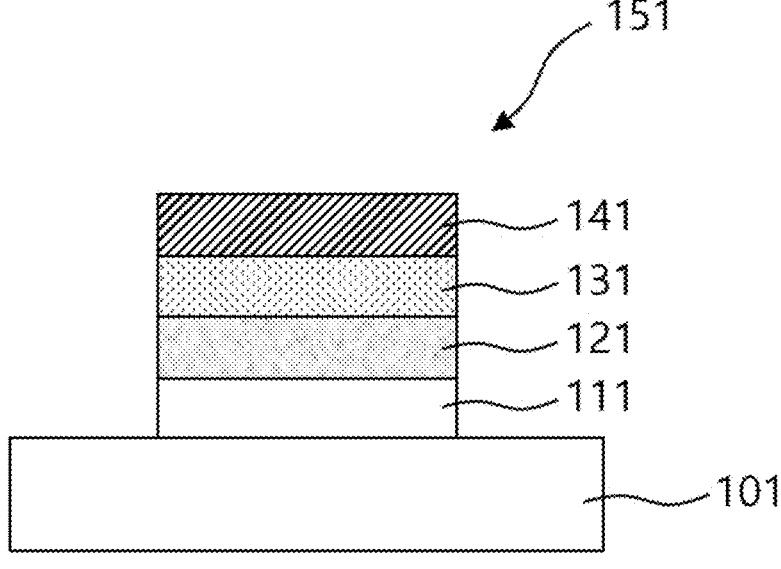

Referring to FIG. 4E, a memristor device 151 may be formed by patterning a stacked structure in which the first electrode 111, the insertion layer 121, the resistance change layer 131, and the second electrode 141 are sequentially stacked according to a predetermined shape. However, the fabricating method of the memristor device 151 described with reference to FIGS. 4A to 4E is exemplary, and may be variously changed.

The memristor device 151 illustrated in FIG. 4E may have the same structure and characteristics as the memristor device 150 described with reference to FIG. 1. Accordingly, an ECM filament may be formed in the resistance change layer 131, and a VCM filament may be formed in the insertion layer 121. The memristor device 151 may have a synaptic characteristic according to a change in resistance of the resistance change layer 131. In addition, various characteristics of the memristor device 151 of FIG. 4E may be understood by referring to the explanations described with reference to FIG. 1.

Figure 5:
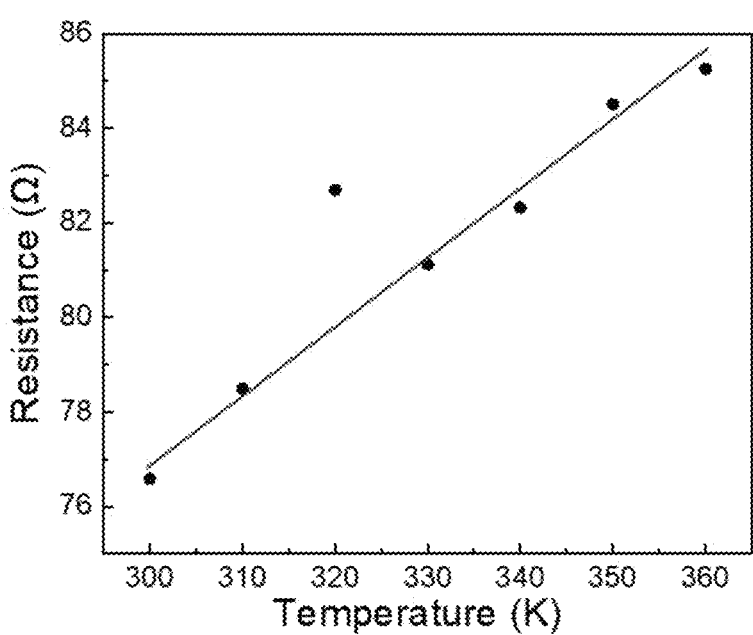
FIG. 5 is a graph showing a change in resistance according to an increase in temperature of a memristor device according to an embodiment of the present disclosure.

FIG. 5 is a graph showing a change in resistance ($\Omega$) according to an increase in temperature (K) of a memristor device according to an embodiment of the present disclosure. The memristor device has a Cu electrode/pV3D3 layer/$Al_2O_3$ layer/Pt electrode structure. Here, the Pt electrode is a first electrode (inactive electrode), the $Al_2O_3$ layer is an insertion layer, the pV3D3 layer is a resistance change layer, and the Cu electrode is a second electrode (active electrode). As a temperature increases, drift of a conductive filament (i.e., ECM filament) may occur in the resistance change layer. Here, a conductive filament having a high conductivity of 10000 $\mu$S or more was used.

Figure 6:
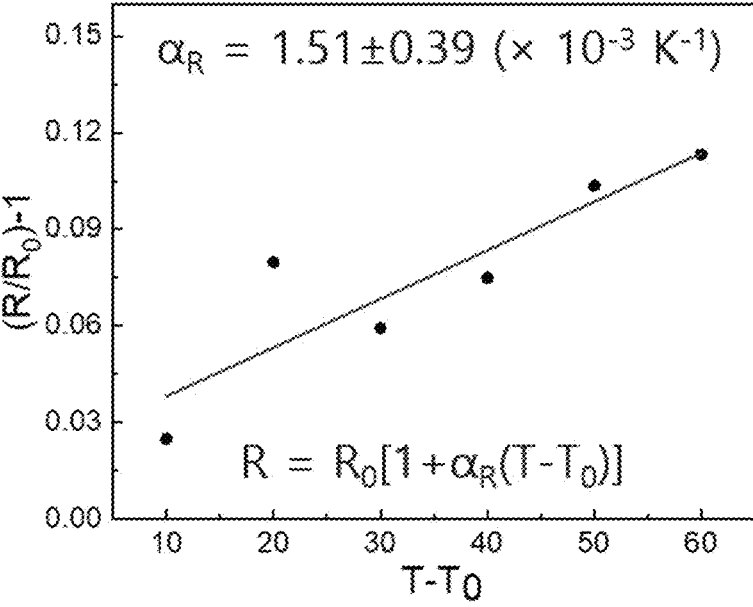
FIG. 6 is a graph obtained from the results of FIG. 5 and showing a relationship between a $T–T_0$ value and an $(R/R_0)–1$ value.

FIG. 6 is a graph obtained from the results of FIG. 5 and showing a relationship between a $T–T_0$ value and an $(R/R_0)–1$ value. Here, $T_0$ is an initial temperature, T is a changed temperature, $R_0$ is an initial resistance at the temperature $T_0$, and R is a resistance at the temperature T.

Referring to FIG. 6, a temperature coefficient of resistance ($\alpha_R$) may be extracted from resistance values in a range of 300 K to 360 K of FIG. 5 by using Equation $R=R_0[1+\alpha_R(T–T_0)]$. Here, the temperature coefficient of resistance ($\alpha_R$) was $1.51\pm0.39$ ($\times10^{-3}$ $K^{-1}$) [i.e., $\alpha_R=1.51\pm0.39$ ($\times10^{-3}$ $K^{-1}$)].

Figure 7:
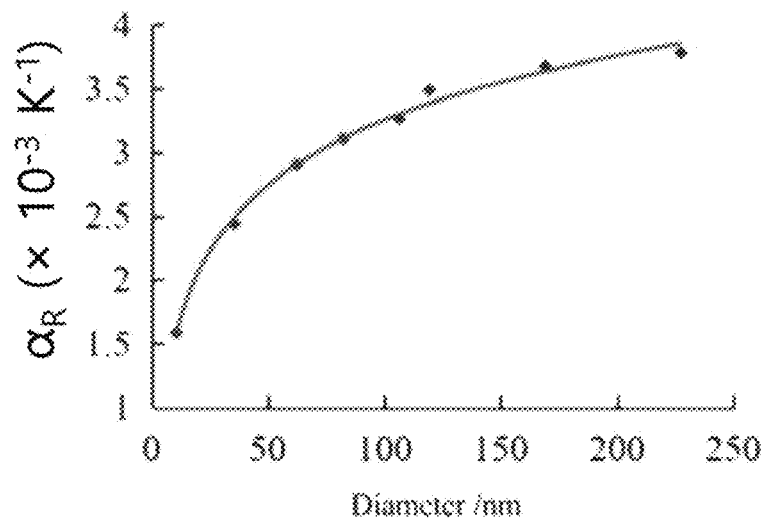
FIG. 7 is a graph showing a change in temperature coefficient of resistance according to a diameter of a Cu nanowire.

In the case of bulk Cu, the temperature coefficient of resistance ($\alpha_R$) is about 4.1 ($\times10^{-3}$ $K^{-1}$), but when a diameter of a Cu wire is thinned to a nanoscale level like a Cu nanowire, the temperature coefficient of resistance ($\alpha_R$) may be reduced to a 1.5 ($\times10^{-3}K^{-1}$) level. This may be confirmed from the graph of FIG. 7 showing a change in the temperature coefficient of resistance ($\alpha_R$) according to a diameter of the Cu nanowire. FIG. 7 is prepared from known data.

Therefore, from the temperature coefficient of resistance ($\alpha_R$) obtained as shown in FIG. 6, it may be confirmed that the conductive filament of the memristor device according to the embodiment of the present disclosure has a temperature coefficient of resistance ($\alpha_R$) similar to that of the Cu nanowire having a nanoscale. This means that the conductive filament formed in the resistance change layer is a Cu filament formed by diffusion of Cu ions from the second electrode.

Figure 8:
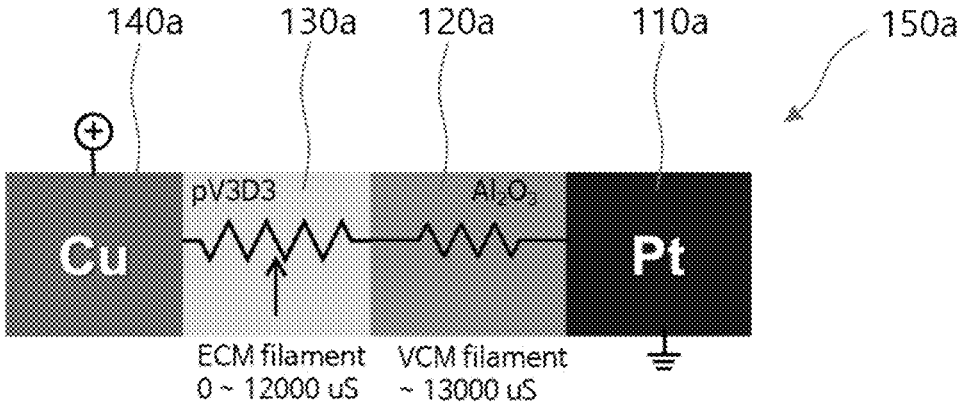
FIG. 8 is a cross-sectional view schematically illustrating a memristor device according to an embodiment of the present disclosure.

FIG. 8 is a cross-sectional view schematically illustrating a memristor device 150a according to an embodiment of the present disclosure.

Referring to FIG. 8, the memristor device 150a may include an insertion layer 120a and a resistance change layer 130a that are disposed between a first electrode 110a and a second electrode 140a. Here, the first electrode 110a may be a Pt electrode, the insertion layer 120a may be an $Al_2O_3$ layer, the resistance change layer 130a may be a pV3D3 layer, and the second electrode 140a may be a Cu electrode. A VCM filament may be formed in the insertion layer 120a. As an ECM filament is generated and collapsed in the resistance change layer 130a according to an application condition of an electrical signal, the resistance of the memristor device 150a in which the VCM filament and the ECM filament are electrically connected in series may be changed. The insertion layer 120a in which the VCM filament is formed may have a conductivity value of about 13000 $\mu$S, and a conductivity value of the resistance change layer 130a may be changed in a range of about 0 to about 12000 $\mu$S.

Figure 9:
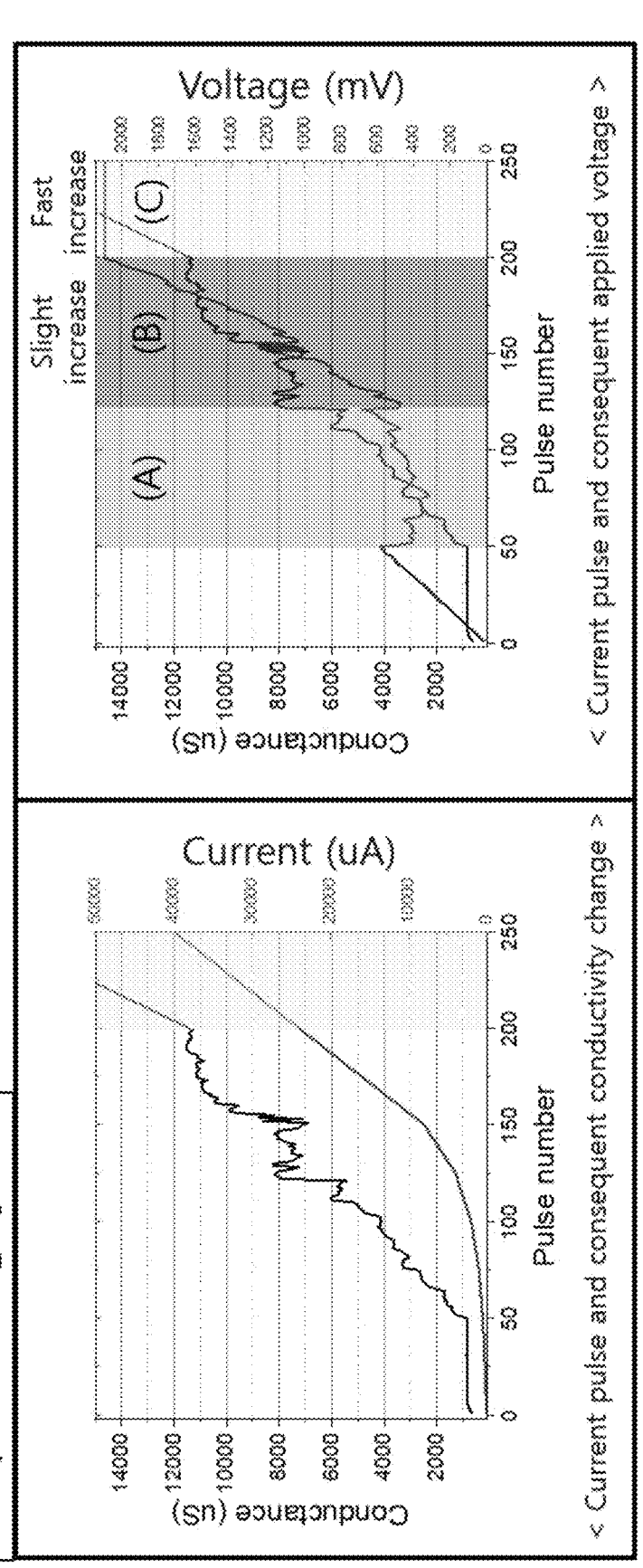
FIG. 9 provides graphs showing a current pulse applied to a memristor device, and a change in conductivity and a change in applied voltage accordingly.

FIG. 9 provides graphs showing a current pulse applied to a memristor device according to an embodiment of the present disclosure, and a change in conductivity and a change in applied voltage accordingly. In FIG. 9, the left graph shows the change in conductivity according to application times of the current pulse (referred to as a "pulse number"), and the right graph shows the change in applied voltage according to the application times of the current pulse. In this embodiment, the memristor device has the Cu/pV3D3/$Al_2O_3$/Pt structure as described with reference to FIG. 8.

Figure 10:
FIG. 10 provides graphs showing a current pulse applied to a memristor device according to a comparative example, and a change in conductivity and a change in applied voltage accordingly.
Figure 10:
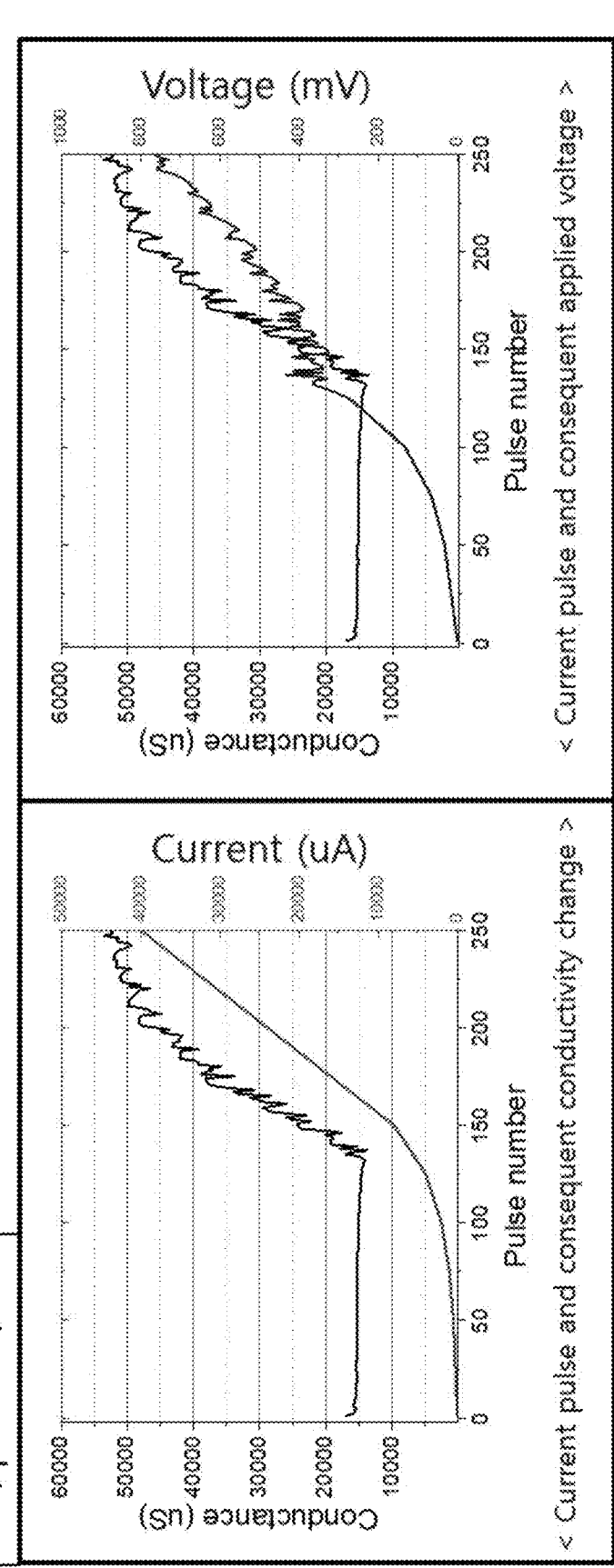

FIG. 10 provides graphs showing a current pulse applied to a memristor device according to a comparative example, and a change in conductivity and a change of applied voltage accordingly. In FIG. 10, the left graph shows the change in conductivity according to application times of the current pulse, and the right graph shows the change in applied voltage according to the application times of the current pulse. Here, the memristor device according to the comparative example has a Cu/pV3D3/Pt structure. That is, the memristor device according to the comparative example has a structure in which the insertion layer ($Al_2O_3$ layer) is excluded from the structure according to the embodiment of the present disclosure.

Referring to FIG. 9 and FIG. 10, it may be seen that the memristor device according to the embodiment and the memristor device according to the comparative example exhibit different characteristics.

Referring to FIG. 10, in the memristor device according to the comparative example, the conductivity is continuously increased in a high current pulse region, and the degree of voltage increase according to the increase of the application times of the current pulse is not relatively large.

In contrast, referring to FIG. 9, in the memristor device according to the embodiment, the conductivity is slowly increased in the high current pulse region. In addition, although the applied voltage did not increase significantly in a low conductivity region (i.e., a region (A)), the applied voltage increases rapidly from the 125th current pulse in a region (B), and the applied voltage is saturated due to a compliance voltage from the 200th current pulse in a region (C).

Referring back to FIGS. 8 to 10, a difference in conductivity update characteristics in the comparative example and the embodiment may be generated according to whether an insertion layer ($Al_2O_3$ layer) is included in a memristor device or not. In the memristor device according to the embodiment, since the VCM filament formed in the insertion layer ($Al_2O_3$ layer) acts as a voltage dividing component, the memristor device may have a conductivity update characteristic different from that of the memristor device according to the comparative example. When the ECM filament formed in the resistance change layer (pV3D3 layer) in the memristor device according to the embodiment has low conductivity, most of voltage drop in the memristor device may occur in the ECM filament. However, when the conductivity of the ECM filament rises gradually and thus it becomes similar to that of the VCM filament, a voltage applied to the ECM filament gradually decreases due to voltage distribution between the insertion layer ($Al_2O_3$ layer) and the resistance change layer (pV3D3 layer). Thus, a voltage having a higher level may be required for the overall conductivity update.

Figure 11A:
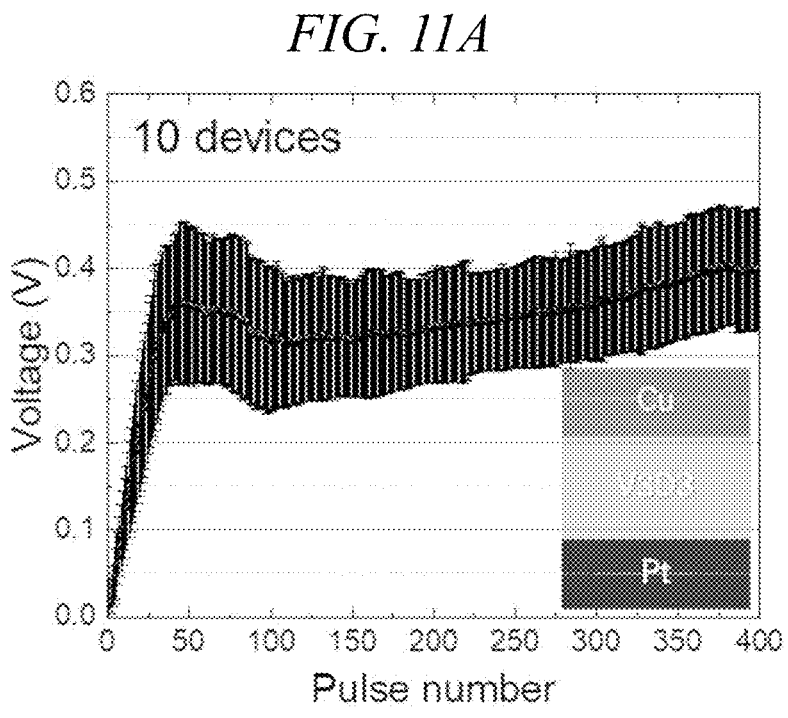
FIGS. 11A to 11C provide graphs showing a change in voltage applied to a memristor device when a current sweep operation is performed on the memristor device according to a comparative example and an embodiment.
Figure 11B:
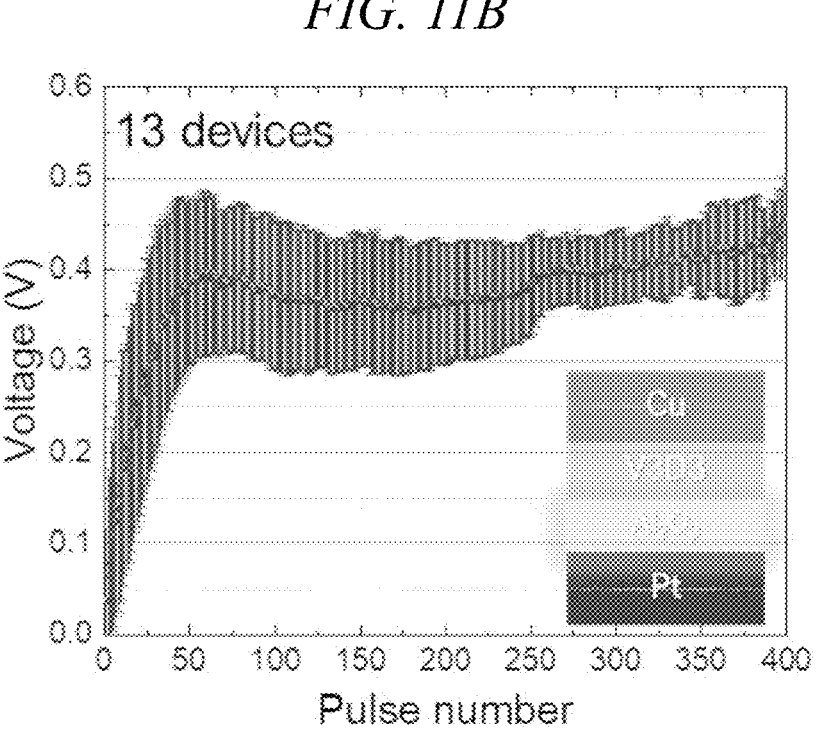
Figure 11C:
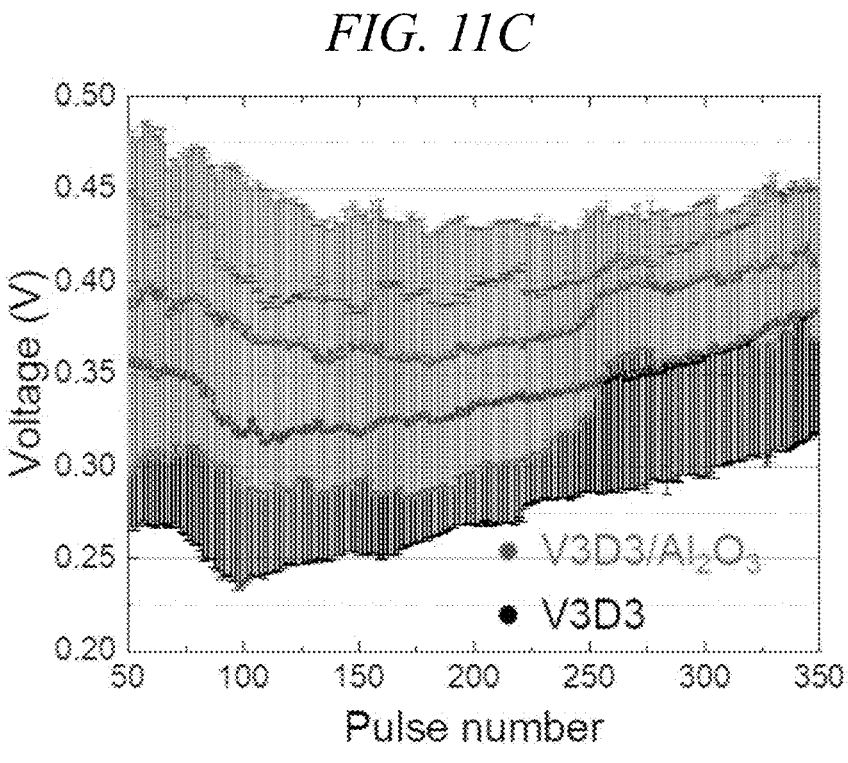

FIGS. 11A to 11C provide graphs showing a change in voltage applied to memristor devices when a current sweep operation is performed on the memristor devices according to a comparative example and an embodiment. FIG. 11A shows the change in voltage applied to the memristor device according to the comparative example that has a Cu/pV3D3/Pt structure. FIG. 11B shows the change in voltage applied to the memristor device according to the embodiment that has a Cu/pV3D3/$Al_2O_3$/Pt structure. FIG. 11C provides a graph overlapping the graphs of FIGS. 11A and 11B in a predetermined pulse number range.

Referring to FIG. 11C, it may be seen that the voltage applied to flow the same current is generally larger in the memristor device according to the embodiment than in the comparative example. This is because of a phenomenon that the movement of electrons from the first electrode (inert electrode) to the second electrode (active electrode) is reduced due to the insertion layer ($Al_2O_3$ layer). Reduction of the movement of electrons to the second electrode (active electrode) may reduce an oxidation-reduction rate (i.e., redox rate) of active metal ions (i.e., Cu ions) in the resistance change layer, which may change a shape of a conductive filament in the resistance change layer. For example, when the oxidation-reduction rate (i.e., redox rate) decreases, conical shaped filaments may be dominantly formed in the resistance change layer. By applying the insertion layer ($Al_2O_3$ layer), it is possible to control the distribution of Cu ions (active metal ions), e.g., the Cu concentration gradient, in the resistance change layer, through electrical stimulation.

Figure 12A:
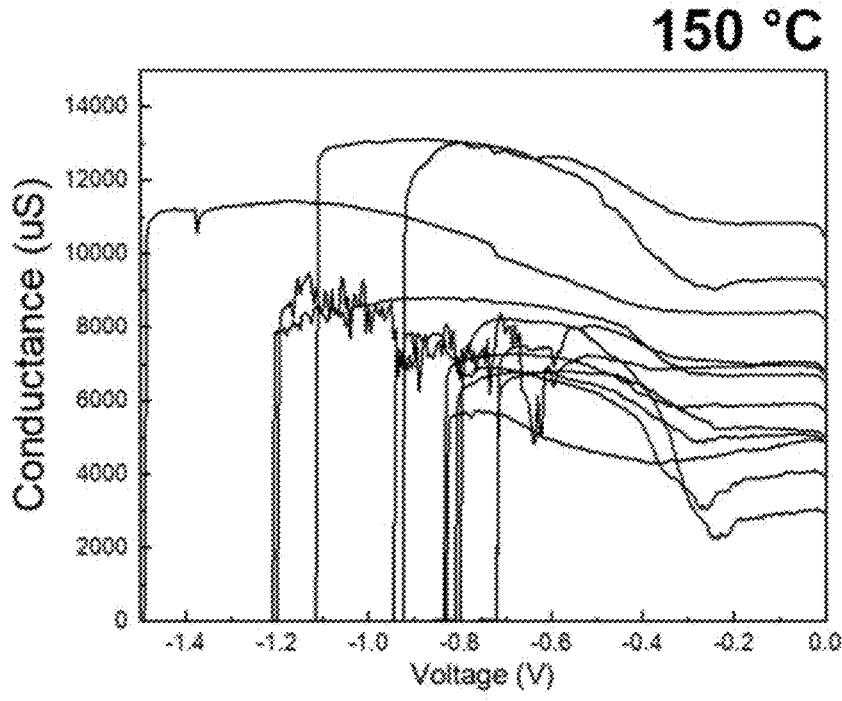
FIGS. 12A to 12C provide graphs showing a reset characteristic of a memristor device according to a voltage sweep immediately after the memristor device is formed according to an embodiment of the present disclosure.
Figure 12B:
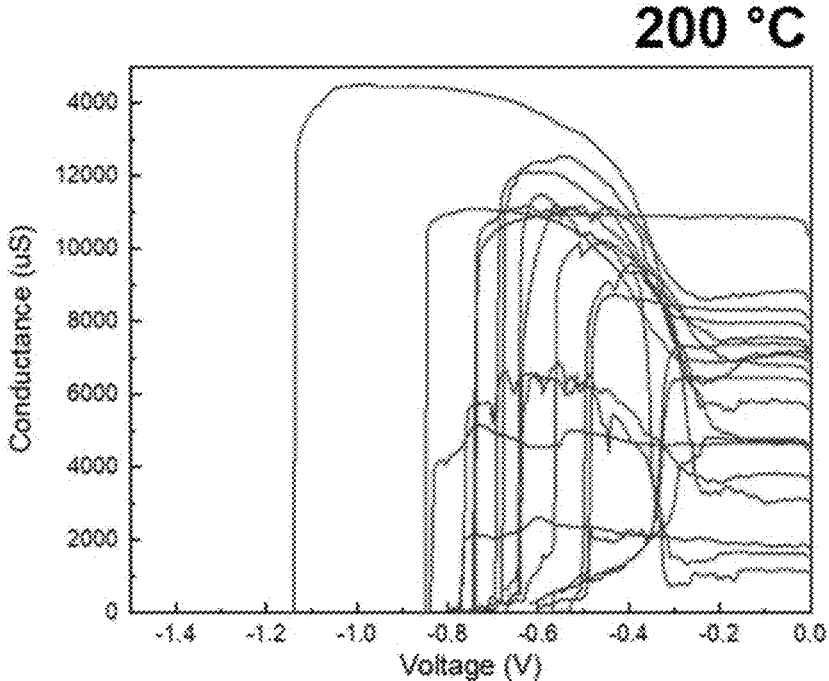
Figure 12C:
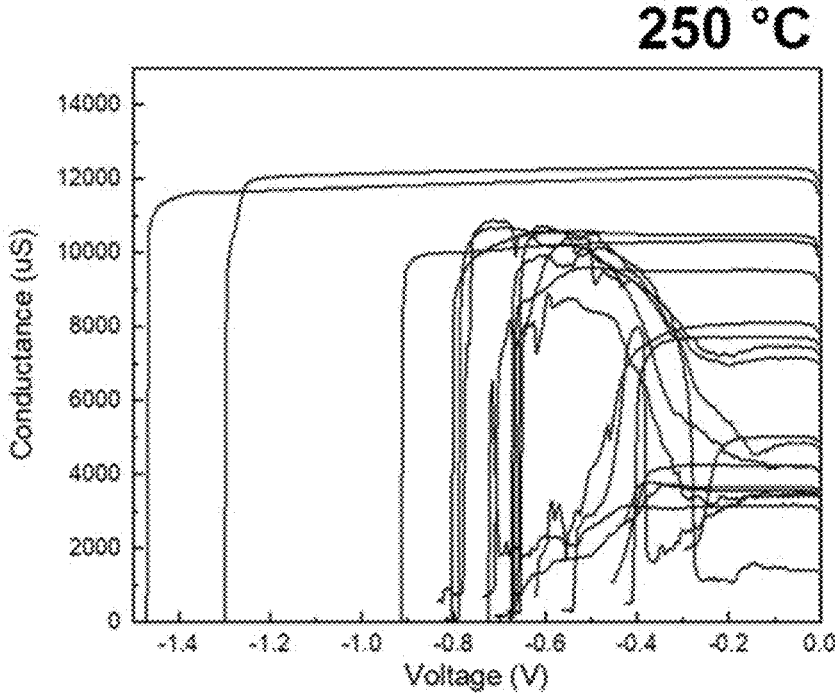

FIGS. 12A to 12C provide graphs showing a reset characteristic of a memristor device according to a voltage sweep immediately after a forming process of the memristor device according to an embodiment manufactured under various conditions. The memristor device has a Cu/pV3D3/$Al_2O_3$/Pt structure. FIGS. 12A to 12C show graphs obtained when the ALD deposition temperature (process temperature) of the $Al_2O_3$ layer was 150° C., 200° C., and 250° C., respectively.

Referring to FIGS. 12A to 12C, although a conductivity value, i.e., conductance, is significantly decreased as a result of a reset attempt after the initial forming process, the conductivity value is initially increased in some regions. This is a phenomenon called negative set (N-SET), and may occur because of Cu ions or clusters remaining during the initial forming process in the periphery of the formed filament. This phenomenon may be observed in most devices immediately after the forming process.

However, in some devices of FIGS. 12B and 12C, this phenomenon did not occur and the devices showed a stable set phenomenon in which the conductivity value is gradually decreased. In addition, in the devices in which the ALD deposition temperature of the $Al_2O_3$ layer is 200° C. and 250° C. as shown in FIGS. 12B and 12C, it may be assumed that a reset voltage is mostly about 0.8 V or less, and no additional electrical stress for reset is applied to the resistance change layer.

However, in a device in which the ALD deposition temperature of the $Al_2O_3$ layer is 150° C. as shown in FIG. 12A, most reset occurs at 0.8 V or higher. In this case, more deterioration of the resistance change layer and reduction in operational reliability may be caused by generating enhanced Joule heating in the device.

Accordingly, it may be preferable that the ALD deposition temperature of the $Al_2O_3$ layer is about 200° C. or higher, for example, about 200 to 300° C.

Figure 13A:
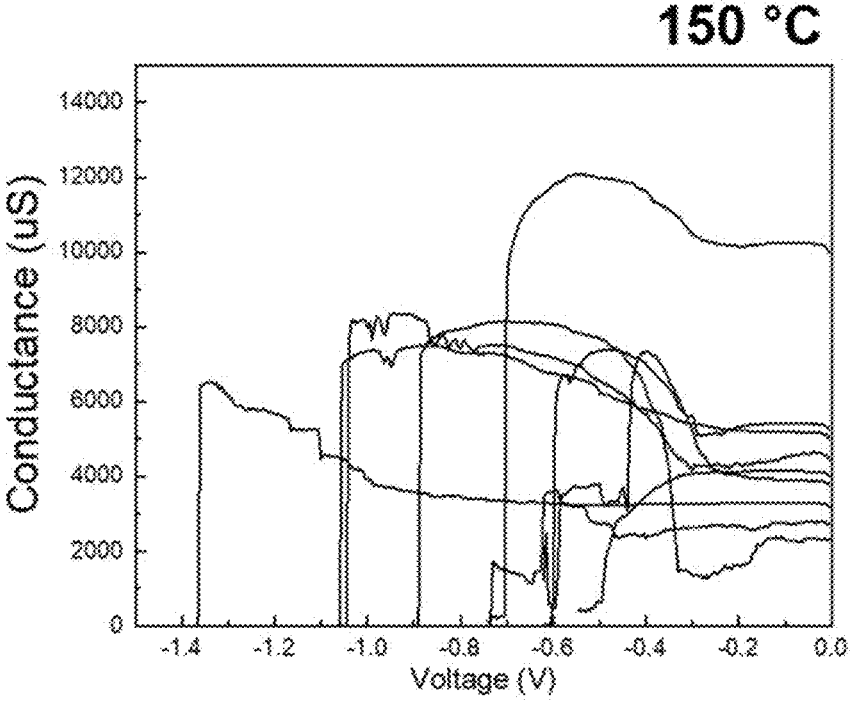
FIGS. 13A to 13C provide graphs showing a reset characteristic of a memristor device according to a voltage sweep after the memristor device is formed and then several switching operations are performed on the memristor device according to an embodiment of the present disclosure.
Figure 13B:
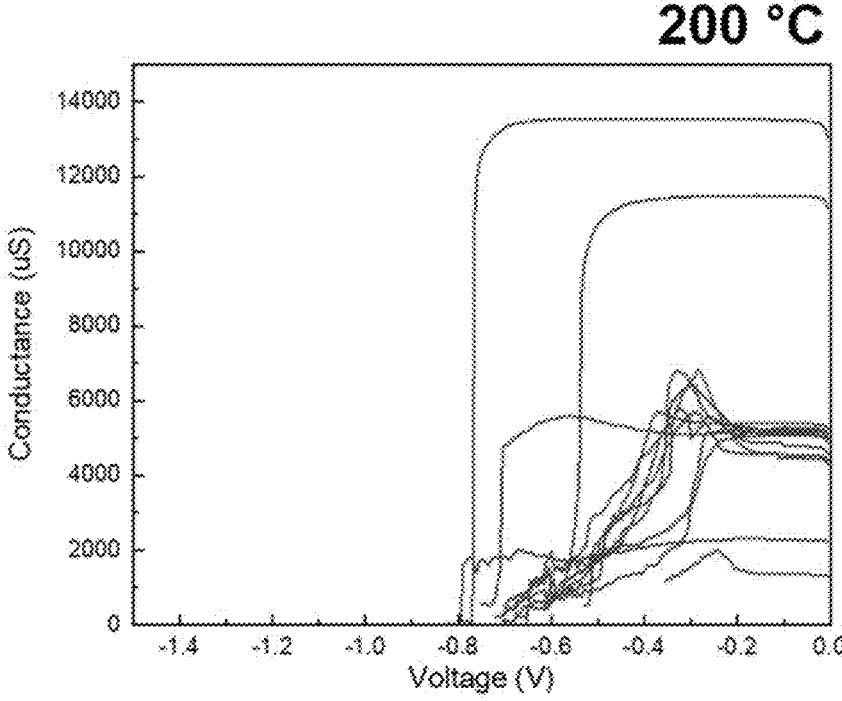
Figure 13C:
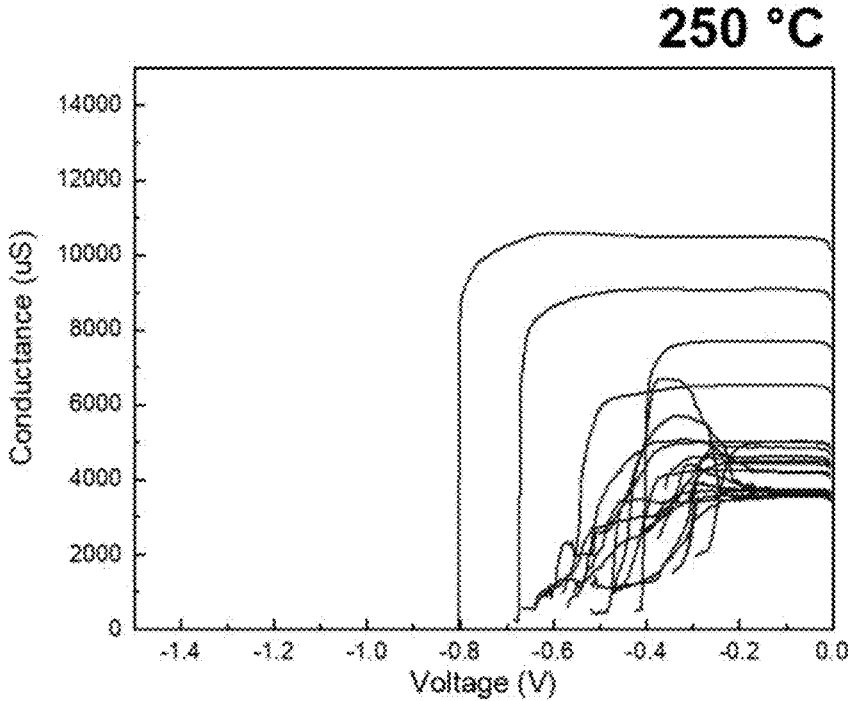

FIGS. 13A to 13C provide graphs showing a reset characteristic of the memristor device according to the voltage sweep after the forming process of the memristor device is performed and then the switching operation is performed several times (e.g., 2 to 3 times) according to the embodiment manufactured under various conditions. The memristor device has a Cu/pV3D3/$Al_2O_3$/Pt structure. FIGS. 13A to 13C show graphs obtained when the ALD deposition temperature (process temperature) of the $Al_2O_3$ layer was 150° C., 200° C., and 250° C., respectively.

Referring to FIGS. 13A to 13C, immediately after initial forming, unlike the aspects (FIGS. 12A to 12C) in which the N-SET phenomenon appeared at all deposition temperatures, in the device in which the ALD deposition temperature of the $Al_2O_3$ layer is 200° C. and 250° C. as shown in FIGS. 13B and 13C, the N-SET phenomenon is rapidly reduced and a gradual reset occurs.

However, in the device in which the ALD deposition temperature of the $Al_2O_3$ layer is 150° C. as shown in FIG. 13A, the N-SET phenomenon occurs even after several reset operations are performed. This means that when an $Al_2O_3$ thin film deposited at a relatively low temperature is embedded in the device, relatively many Cu ions or clusters may remain therein. This may be because the mobility of Cu ions in the $Al_2O_3$ thin film increases as the deposition temperature of the $Al_2O_3$ thin film decreases.

In addition, the movement of active metal ions in the $Al_2O_3$ layer which is deposited by a high-temperature process and has a relatively high density may be restricted by a relatively high activation energy. Therefore, in this case, as the collapse of the filament is delayed due to a stable structure around the filament, the long-term state reliability may be improved. In addition, when using the $Al_2O_3$ layer having a relatively high density because it is deposited by a high-temperature process, it is possible to minimize the diffusion of penetrating active metal ions while minimizing the degradation of the device film quality, and accordingly, the fluctuation of the conductivity value may be reduced.

As described above with reference to FIGS. 12A to 12C and FIGS. 13A to 13C, when using the Al₂O₃ layer deposited at the process temperature of about 200° C. or higher, it is possible to suppress or prevent device degradation and to significantly improve the reliability (long-term state reliability) of the synaptic operation. By applying the Al₂O₃ layer deposited through the process temperature of about 200° C. or higher, it is possible to secure controlling the Cu concentration gradient, reduction of deterioration of the thin film (e.g., resistance change layer), and improvement of the reliability of the synaptic operation (e.g., analog switching operation) of the memristor device.

Figure 14:
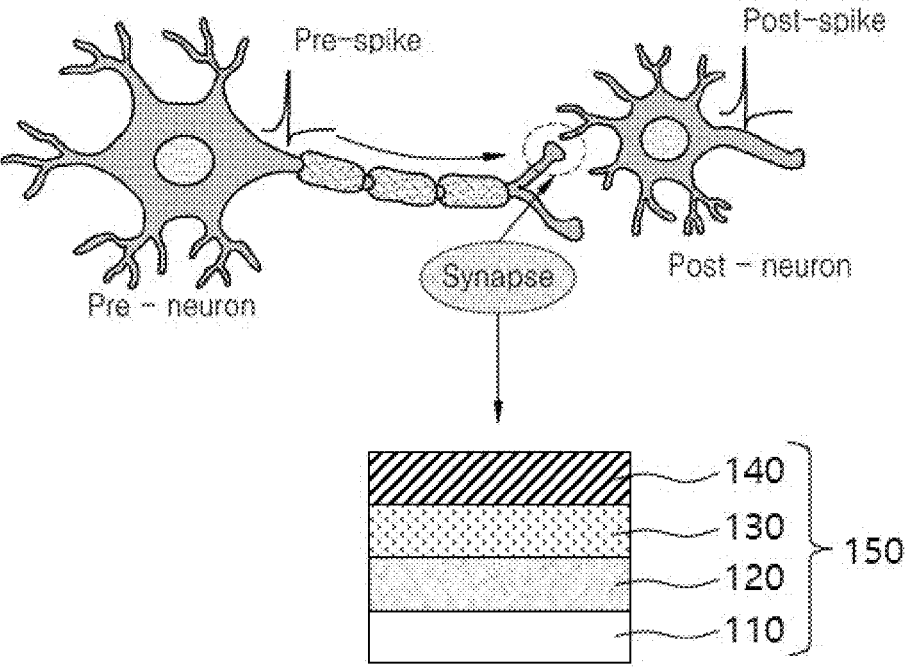
FIG. 14 is a conceptual view illustrating a synaptic device including a memristor device according to an embodiment of the present disclosure.

FIG. 14 is a conceptual view illustrating a synaptic device that includes the memristor device 150 according to an embodiment of the present disclosure.

Referring to FIG. 14, when configuring, as a circuit, a synapse which is a connection part between a pre-neuron and a post-neuron, the memristor device 150 may be applied. The pre-neuron may input a pre-spike signal to the synapse, the synapse may transmit a predetermined synaptic signal to the post-neuron, and the post-neuron may generate a post-spike signal. Similar to the configuration in which the synapse connects the pre-neuron and the post-neuron, the memristor device 150 may serve to connect a pre-synaptic neuron circuit and a post-synaptic neuron circuit.

Figure 15:
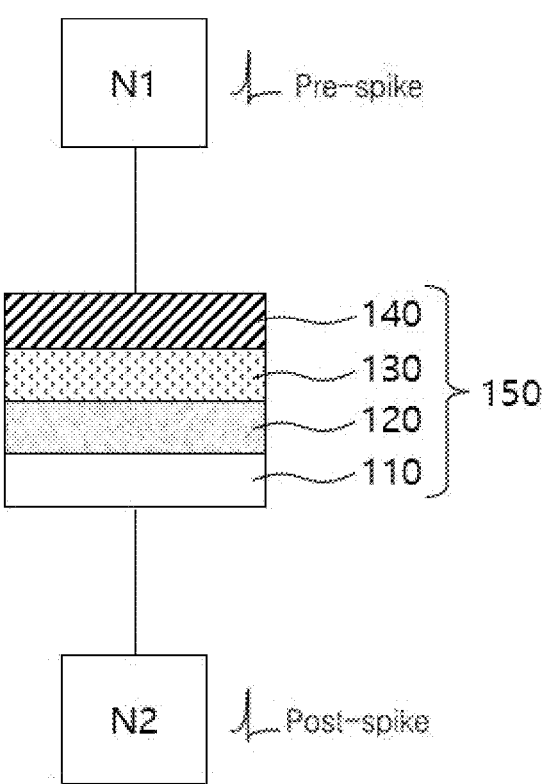
FIG. 15 is a cross-sectional view illustrates a synaptic device including a memristor device according to an embodiment of the present disclosure.

FIG. 15 is a cross-sectional view illustrating a synaptic device including the memristor device 150 according to an embodiment of the present disclosure.

Referring to FIG. 15, the second electrode 140 of the memristor device 150 may be connected to a pre-synaptic neuron circuit N1. The first electrode 110 of the memristor device 150 may be connected to a post-synaptic neuron circuit N2. Therefore, when a pre-spike signal is applied from the pre-synaptic neuron circuit N1 to the second electrode 140, a synaptic signal, that is, a post-synaptic current may flow to the post-synaptic neuron circuit N2 through the first electrode 110. A post-spike signal may be generated from the post-synaptic neuron circuit N2. As an electrical signal is applied between the first electrode 110 and the second electrode 140, potentiation or depression may occur in the memristor device 150.

Figure 16:
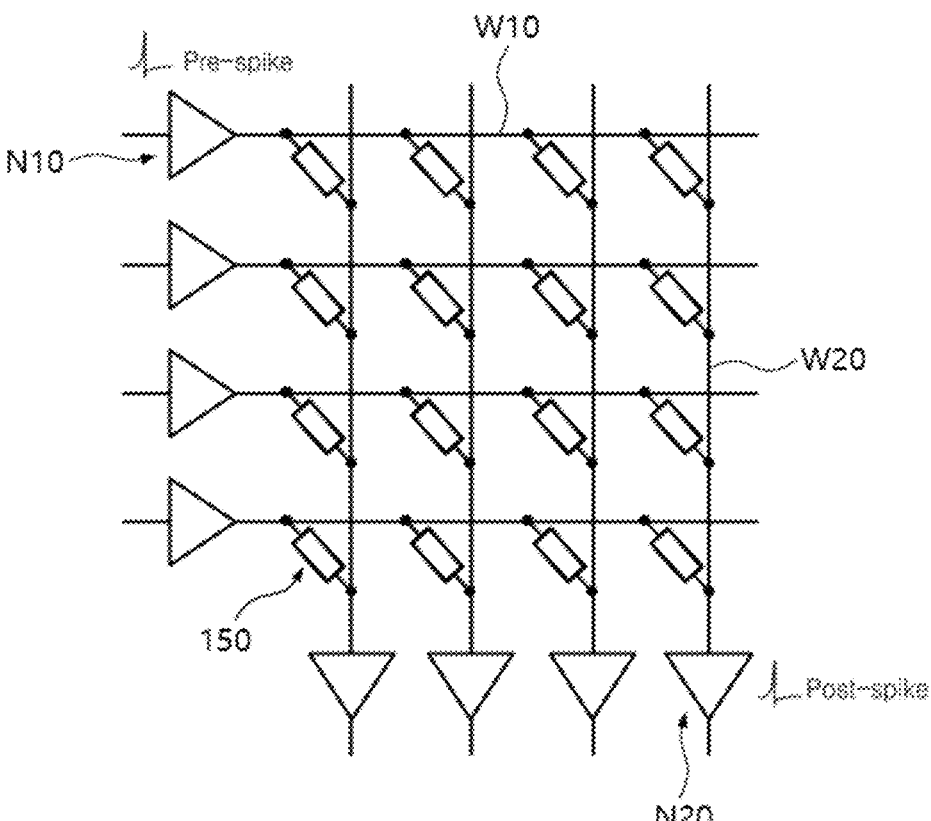
FIG. 16 illustrates a synaptic array including memristor devices according to an embodiment of the present disclosure.

FIG. 16 illustrates a synaptic array device to which the memristor device 150 according to an embodiment of the present disclosure is applied.

Referring to FIG. 16, a plurality of memristor devices 150 may be arranged in a matrix including a plurality of columns and a plurality of rows. A plurality of first wirings W10 may be arranged to cross a plurality of second wirings W20, and the memristor device 150 may be provided at intersections of one of the plurality of first wirings W10 and a corresponding one of the plurality of second wirings W20. The first wiring W10 may be connected to the second electrode of the memristor device 150, and the second wiring W20 may be connected to the first electrode of the memristor device 150. The first wiring W10 may be connected to a pre-synaptic neuron circuit N10, and the second wiring W20 may be connected to a post-synaptic neuron circuit N20.

A pre-spike signal may be applied from the pre-synaptic neuron circuit N10 to the second electrode of the memristor device 150 through the first wiring W10. A synaptic signal, that is, a post-synaptic current, may flow to the post-synaptic neuron circuit N20 through the first electrode of the memristor device 150. A post-spike signal may be generated from the post-synaptic neuron circuit N20.

According to another embodiment of the present disclosure, a neuromorphic device to which the synaptic array device according to the above-described embodiment is applied, and a system thereof may be configured. Since the configuration of the neuromorphic device and the system thereof are well known, a detailed description thereof will be omitted.

According to the embodiments of the present disclosure described above, it is possible to implement a memristor device having excellent and stable synaptic characteristics (e.g., analog switching characteristics), as well as characteristics of reaching a desired target conductivity value and improved long-term state reliability. In addition, it is possible to implement a synaptic device and a neuromorphic device having excellent performance and reliability (e.g., long-term state reliability) by applying the memristor device according to these embodiments thereto.

In the present specification, the preferred embodiments have been disclosed, and although specific terms are used, these are only used in a general sense to easily describe the technical contents of the present invention and to help the understanding of the present invention, and are not used to limit the scope of the present invention. It will be apparent to those of ordinary skill in the art to which the present invention pertains that other modifications based on the technical spirit of the present invention may be implemented in addition to the embodiments disclosed herein. It will be appreciated to those of ordinary skill in the art that a memristor device, a fabricating method thereof, a synaptic device including the memristor device, and a neuromorphic device including the synaptic device, which are described with reference to FIG. 1 to FIG. 9 and FIG. 11 to FIG. 16, may be variously substituted, changed, and modified without departing from the spirit of the present invention. Therefore, the scope of the invention should not be determined by the described embodiments, but should be determined by the technical concepts described in the claims.

What is claimed is:

1. A memristor device comprising:
a first electrode;
a second electrode disposed to be spaced apart from the first electrode;
a resistance change layer disposed between the first electrode and the second electrode and including a polymer; and
an insertion layer disposed between the first electrode and the resistance change layer and including an oxide,
wherein an electrochemical metallization mechanism (ECM) filament is formed in the resistance change layer, and a valence change mechanism (VCM) filament is formed in the insertion layer, and
wherein the polymer includes V3D3 (1,3,5-trivinyl-1,3,5-trimethylcyclotrisiloxane).

2. The memristor device of claim 1, wherein the insertion layer includes an Al₂O₃ layer.

3. The memristor device of claim 1, wherein the insertion layer includes an Al₂O₃ layer formed by an atomic layer deposition (ALD) process using a process temperature of 200° C. or higher.

4. The memristor device of claim 1, wherein the insertion layer has a thickness of 1 nm to 50 nm.

5. The memristor device of claim 1, wherein the resistance change layer has a thickness of 5 nm to 100 nm.

6. The memristor device of claim 1, wherein
the resistance change layer is a single film made of the polymer,
the insertion layer is a single film made of the oxide, a first surface of the insertion layer is in contact with the first electrode, and a second surface of the insertion layer is in contact with the resistance change layer, and a first surface of the resistance change layer is in contact with the second surface of the insertion layer, and a second surface of the resistance change layer is in contact with the second electrode.

7. The memristor device of claim 1, wherein the first electrode includes at least one of Pt and Al.

8. The memristor device of claim 1, wherein the second electrode includes at least one of Cu, Ag, and Ni.

9. The memristor device of claim 1, wherein potentiation of the memristor device is performed in a current sweep method by gradually increasing conductivity of the resistance change layer.

10. A synaptic device comprising the memristor device according to claim 1.

11. A neuromorphic device comprising the synaptic device according to claim 10.

12. A method of fabricating a memristor device, the method comprising:

forming a first electrode;

forming an insertion layer including an oxide on the first electrode;

forming a resistance change layer including a polymer on the insertion layer; and forming a second electrode on the resistance change layer, wherein an electrochemical metallization mechanism (ECM) filament is formed in the resistance change layer, a valence change mechanism (VCM) filament is formed in the insertion layer, and the memristor device has a synaptic characteristic according to a change in resistance of the resistance change layer, and wherein the polymer includes V3D3 (1,3,5-trivinyl-1,3, 5-trimethylcyclotrisiloxane).

13. The method of claim 12, wherein the insertion layer includes an $Al_2O_3$ layer.

14. The method of claim 12, wherein the insertion layer includes an $Al_2O_3$ layer formed by an atomic layer deposition (ALD) process using a process temperature of 200° C. or higher.

15. The method of claim 12, wherein the insertion layer has a thickness of 1 nm to 50 nm.

16. The method of claim 12, wherein the resistance change layer is formed by an initiated chemical vapor deposition (iCVD) process.

17. The method of claim 12, wherein the resistance change layer may have a thickness of 5 nm to 100 nm.

* * * * *